United States Patent [19]

Stahlhofen et al.

[11] Patent Number: 5,149,613
[45] Date of Patent: Sep. 22, 1992

[54] PROCESS FOR PRODUCING IMAGES ON A PHOTOSENSITIVE MATERIAL

[75] Inventors: Paul Stahlhofen, Wiesbaden; Dieter Mohr, Budenheim, both of Fed. Rep. of Germany

[73] Assignee: Hoechst Aktiengesellschaft, Frankfurt am Main, Fed. Rep. of Germany

[21] Appl. No.: 440,439

[22] Filed: Nov. 22, 1989

Related U.S. Application Data

[63] Continuation of Ser. No. 192,941, May 12, 1988, abandoned.

[30] Foreign Application Priority Data

May 20, 1987 [DE] Fed. Rep. of Germany ....... 3716848

[51] Int. Cl.$^5$ ................................................. G03C 5/00
[52] U.S. Cl. ..................................... 430/296; 430/270; 430/326; 430/327; 430/328; 430/330; 430/394; 430/942; 430/945; 346/76 R; 346/76 PH; 346/76 L
[58] Field of Search .............. 346/76 R, 76 PH, 76 L; 430/296, 270, 325, 326, 327, 328, 330, 394, 942, 945

[56] References Cited

U.S. PATENT DOCUMENTS

| | | | |
|---|---|---|---|
| 2,681,617 | 6/1954 | Worthen et al. | 101/149.2 |
| 3,475,760 | 10/1969 | Carlson | 346/1 |
| 3,506,779 | 4/1970 | Brown et al. | 178/6.6 |
| 3,515,552 | 6/1970 | Smith | 96/35.1 |
| 3,536,489 | 10/1970 | Smith | 96/28 |
| 3,664,737 | 5/1972 | Lipp | 355/18 |
| 3,745,586 | 7/1973 | Braudy | 346/76 |
| 3,747,117 | 7/1973 | Fechter | 346/1 |
| 3,751,587 | 8/1973 | Insler et al. | 178/6.6 R |
| 3,779,778 | 12/1973 | Smith et al. | 96/115 R |
| 3,836,709 | 9/1974 | Hutchison | 178/6.7 R |
| 4,034,183 | 7/1977 | Uhlig | 219/122 LM |
| 4,056,393 | 11/1977 | Schlesinger et al. | 430/363 |
| 4,101,323 | 7/1978 | Buhr et al. | 96/35 |
| 4,104,070 | 8/1978 | Moritz et al. | 96/36 |
| 4,189,323 | 2/1980 | Buhr | 430/281 |
| 4,196,003 | 4/1980 | Watanabe | 430/193 |
| 4,279,982 | 7/1981 | Iwasaki et al. | 430/170 |
| 4,311,782 | 1/1982 | Buhr et al. | 430/270 |
| 4,421,844 | 12/1983 | Buhr et al. | 430/326 |
| 4,457,999 | 7/1984 | Stahlhofen | 430/344 |
| 4,506,003 | 3/1985 | Ruckert et al. | 430/905 |
| 4,506,006 | 3/1985 | Ruckert | 430/277 |
| 4,544,627 | 10/1985 | Takahashi et al. | 430/325 |
| 4,581,321 | 4/1986 | Stahlhofen | 430/325 |
| 4,619,998 | 10/1986 | Buhr | 544/193.1 |
| 4,678,737 | 7/1987 | Schneller et al. | 430/326 |
| 4,699,867 | 10/1987 | Schneller et al. | 430/220 |
| 4,751,170 | 6/1988 | Mimura et al. | 430/322 |
| 4,764,450 | 8/1988 | Ruckert et al. | 430/277 |
| 4,766,037 | 8/1988 | Watanabe et al. | 430/138 |

FOREIGN PATENT DOCUMENTS

| | | |
|---|---|---|
| 0130599 | 1/1985 | European Pat. Off. . |
| 0164128 | 12/1985 | European Pat. Off. . |
| 2231815 | 1/1974 | Fed. Rep. of Germany . |
| 3544165 | 6/1986 | Fed. Rep. of Germany . |
| 1388492 | 3/1975 | United Kingdom . |
| 1583329 | 1/1981 | United Kingdom . |
| 1583330 | 1/1981 | United Kingdom . |
| 2082339 | 3/1982 | United Kingdom . |
| 2009437 | 9/1982 | United Kingdom . |

*Primary Examiner*—Ellis P. Robinson
*Assistant Examiner*—Donald J. Loney
*Attorney, Agent, or Firm*—Foley & Lardner

[57] ABSTRACT

A process for producing images on a photosensitive material comprising a support and a normally positive-working photosensitive layer is disclosed. The photosensitive layer is activated by exposure to ultraviolet light and imaging is effected by means of thermal energy. A mixture comprising a compound containing at least one —C—O—C— or —C—O—Si— bond which can be split by acid and a compound forming a strong acid upon exposure is employed in the photosensitive layer and imaging in the activated region is carried out by means of laser or electron beams or with the aid of a thermal printer. The process of the invention is suitable for use with digital techniques and makes it possible, in a simple manner, to employ a combined procedure for imaging the photosensitive material (photocomposing).

20 Claims, No Drawings

PROCESS FOR PRODUCING IMAGES ON A PHOTOSENSITIVE MATERIAL

This application is a continuation of application Ser. No. 07/192,941, filed May 12, 1988 is now abandoned.

BACKGROUND OF THE INVENTION

The present invention relates to a process for producing images on a photosensitive material comprising a support and a normally positive-working photosensitive layer, in which the photosensitive layer is activated by exposure to ultraviolet light, imaged by means of thermal energy and developed with an aqueous-alkaline developer.

The advance in digital technique and the increasing supply of appropriate storage media has also produced a rise in the demand for printing plates which can be imaged by digital procedures. In the art of platemaking, various proposals have already been made which are directed toward imaging printing plates without the intermediate step of using a silver film mask.

German Offenlegungsschrift 23 18 133 (corresponding to U.S. Pat. No. 3,836,709) describes a process for the production of a polymeric image by means of laser beams. In this process, a layer having a photohardenable composition is required.

German Auslegeschrift 22 31 815 discloses the imaging of non-photosensitive layers by means of electron beams to produce negative reliefs. The process is technically expensive and due to the type of coating used it is only suitable for producing relatively small print runs. Owing to the technical expenditure and the small print runs obtained, the process has not become accepted in practice.

In U.S. Pat. No. 3,664,737, a printing plate carrying a photosensitive, negative-working layer is described, which is irradiated with a laser, while German Offenlegungsschrift 24 48 325 (corresponding to U.S. Pat. No. 4,034,183) discloses a process for the manufacture of planographic printing forms, in which a support coated with a hydrophilic non-photosensitive layer is irradiated imagewise by means of laser beams and the irradiated material is used for printing in a planographic printing machine, without any further treatment steps.

German Patent 27 28 947 (corresponding to British Patent 1,583,329) describes a process for preparing planographic printing forms, in which a planographic printing plate, which is formed of an anodically oxidized aluminum support and a photosensitive layer comprising a negative-working, photohardenable diazonium compound and an amino resin is irradiated imagewise with a laser beam.

European Patent Application 0 164 128 describes photosensitive copying materials and a process for imaging these materials by means of a YAG laser.

The methods which have become known in the art are, however, attended by various disadvantages. It is either necessary to use inefficient lasers for the imaging procedure, for example, argon-ion lasers operating in the ultraviolet spectral region, or the systems used, for example $CO_2$ lasers, require great expenditure in view of safe practice and equipment technique.

Previously known layers which are sensitive to laser radiation also have the disadvantage that, on the one hand, the relatively highly photosensitive layers, such as those described in German Offenlegungsschrift 27 28 858 (corresponding to British Patent 1,583,330) for exposure to an argon-ion laser, have only a very limited thermal stability and consequently an insufficient shelf-life while, on the other hand, the layers according to German Offenlegungsschrift 24 48 325 (corresponding to U.S. Pat. No. 4,034,183) may have a very high thermal stability, but require extremely high energies for exposure. It is another disadvantage that reduction of the energies required for hardening the layer is invariably at the expense of thermal stability.

U.S. Pat. No. 4,544,627 discloses a negative-working imaging process, wherein the photosensitive material containing in its photosensitive layer an o-quinone diazide compound and a basic compound which facilitates conversion of the quinone diazide compound into an insoluble indene carboxylic acid derivative, is subjected to an overall irradiation, then imagewise exposed to laser light and subsequently developed. It has been found, however, that layers of that kind are not yet up to the highest standards, since their sensitivity to light is insufficient and they are not fully adapted for work in step-and-repeat machines.

SUMMARY OF THE INVENTION

It is therefore an object of the present invention to provide a process for producing images on a photosensitive material, for example, a printing plate, by means of laser beams or electron beams or thermal imaging methods, e.g., using a thermal printer, which process does not have the above-indicated disadvantages and in which the incongruity, existing in any of the previously described processes, between the storage stability of the material and the possibility of using economical and digitally operating imaging systems is overcome.

In accordance with these and other objects of the invention, there is provided a process for producing images on a photosensitive support comprising a support and a normally positive-working photosensitive layer comprising the steps of activating the photosensitive layer by exposure to ultraviolet light, imaging by means of thermal energy, and developing with an aqueous-alkaline developer, wherein a mixture comprising a compound containing at least one —C—O—C— or —C—O—Si— bond which can be split by acid and a compound forming a strong acid upon exposure is employed in the photosensitive layer and imaging in the activated region is carried out by means of laser beams, electron beams or a thermal printer.

In a first embodiment, the photosensitive material is exposed under a positive original and an image is then produced in the non-image areas of the positive image by means of laser beams, electron beams or a thermal printer.

In a second embodiment, the photosensitive material is exposed under a negative original, thereafter heated and subjected to an overall exposure and an image is then produced in the non-image areas by means of laser beams, electron beams or a thermal printer.

In a third embodiment, the photosensitive material is exposed under a negative original, thereafter heated and exposed under a positive original in the non-image areas and an image is then produced in the remaining non-image areas by means of laser beams, electron beams or a thermal printer.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF PREFERRED EMBODIMENTS

In the process of the above-described kind, using a normally positive-working photosensitive material, a mixture comprising a compound containing at least one —C—O—C— or —C—O—Si— bond which can be split by acid and a compound forming a strong acid upon exposure is employed in the photosensitive layer and imaging in the activated region is carried out by means of laser or electron beams or with the aid of a thermal printer.

Preferably, a high-power ion laser having an emission above about 500 nm is used for thermal imaging. In the case of thermal imaging with electron beams, the electron beams used preferably have a current strength of at least about 1 $\mu$A and an accelerating voltage above about 10 kV. Thermal imaging is preferably carried out by point-for-point heating using a thermal printer.

The photosensitive materials used in the process of the present invention have the property of being thermally hardenable in the exposed layer areas. This property is utilized in the invention. The highly photosensitive, normally positive-working photosensitive layer, which is distinguished by excellent shelf-life and thermal stability, is activated by light, i.e., after a preceding exposure, the layer can be hardened imagewise under the action of thermal energy.

Reversal processes for the preparation of negative copies from a photosensitive material based on 1,2-quinone diazides, with the aid of ultraviolet light, using customary copying equipment, such as tubular lamps, pulsed xenon lamps, metal-halide-doped mercury vapor lamps or carbon arc lamps are known in the art. These reversal processes, however, require appropriate additives to the photosensitive layer and a particular sequence of treatment steps. British Patent 2,082,339 describes a reversal process of that kind, in which a photosensitive mixture comprising a 1,2-quinone diazide and at least one resole can also be processed as a negative-working recording material, after a sequence of particular processing steps. In German Offenlegungsschriften 28 55 723 and 25 29 054 (corresponding to U.S. Pat. No. 4,104,070) resist layers based on 1,2-quinone diazides are described, which are used for a reversal process and contain, as an additive, N-acyl-N'-methylethylenediamine or hydroxyethylimidazoline. A similar material containing secondary or tertiary amines is described in U.S. Pat. No. 4,196,003, while European Patent Application 0 133 216 (corresponding to U.S. Pat. No. 4,581,321) discloses a reversal process, in which the quinone-diazide-containing photosensitive layer contains a hexamethylol melamine ether as an additive.

The aforementioned reversal processes basically include the same sequence of processing steps comprising imagewise exposing the printing plate under a negative film, followed by heating at 100° to 150° C. for 1 to 5 minutes, subjecting the cooled-down plate to an overall re-exposure without an original and then developing by means of an aqueous-alkaline developer. Image reversal is due to the fact that the photodecomposition products form an insoluble reaction product upon heating.

The present invention also provides a process for the preparation of a printing form by means of a photo-sensitive material comprising a support and a photosensitive layer, wherein the photosensitive material is exposed under a positive original and an image is then produced in the non-image areas of the positive image by means of laser or electron beams or with the aid of thermal imaging methods, e.g., with a thermal printer, and the material is then developed with an aqueous-alkaline developer.

For the purposes of the present invention any lasers of appropriate power are suitable, which preferably emit at wavelengths above about 500 nm, for example, krypton or YAG lasers. In addition, imaging can also be effected by irradiation with electron beams or by methods which are, for example, used in thermal printers.

Thermal printers are equipped with heatable metal needles, the temperature of which is controlled. Imaging of the thermosensitive photosensitive layer is achieved by appropriately heating the thermohead on the thermal printer.

For overall exposure to ultraviolet light, i.e., for activating the photosensitive layer prior to thermal imaging, the customary copying equipment can be used, such as tubular lamps, pulsed xenon lamps, metal-halide-doped mercury vapor lamps or carbon arc lamps. The laser beam is controlled by means of a predetermined, programmed line and/or screen movement.

Processes and apparatus for controlling the laser beam by a computer, as well as focusing, modulation or deflection of the beam are not the subject matter of the present invention, but have been described in a number of publications, for example, in U.S. Pat. Nos. 3,751,587; 3,745,586; 3,747,117; 3,475,760; 3,506,779 and 3,664,737.

Moreover, in the process according to the present invention, it not only possible to use the known positive imaging processes, but following imaging according to one of the above-mentioned methods, imaging by means of laser beams, electron beams or thermal printers can additionally be carried out in the exposed non-image areas of a positive image.

For the preparation of a printing form, for example, the normally positive-working photosensitive layer is subjected to an overall exposure, thereafter imaged by means of laser or electron beams and then developed with an aqueous-alkaline solution, without any further intermediate treatment. Apart from this relatively simple imaging procedure using heat generating laser or electron beams, various possible combinations can also advantageously be brought to effect when imaging a printing plate with combined line and screen elements (photocomposing). For example, a positive image can first be produced with the aid of ultraviolet light and a diapositive and laser beams can then be used to produce subsequently, optionally repeatedly, additional images on the printing plate, in the layer areas which have been struck by light and are not yet imaged.

The thermal imaging process according to the invention has the advantage that, in contrast to the hitherto known reversal processes, the additional step of heating in an oven (for 1 to 5 minutes, at 100° to 150° C.) is not required. To activate the photosensitive layer for the purpose of imaging, a preceding exposure step using ultraviolet light is sufficient. Another advantage is the excellent shelf-life of the printing plates which are preferably used according to the invention since, in contrast to the layers known for use in laser imaging, thermal sensitivity is only generated by the preceding exposure step and, moreover, in contrast to the layers used for the reversal process, the photosensitive layers do not require any additional basic or acidic additions which must be present in the known reversal processes to effect hardening of the exposed image areas.

It is a further advantage of the photosensitive material used in the process of the present invention that it has a relatively high photosensitivity, as compared with the well-known photosensitive layers based on o-quinone diazides. Exposure times can be drastically reduced, under otherwise comparable process conditions, i.e., without other disadvantages having to be taken into account.

The process according to the invention can also be carried out in such a way that the photosensitive material is exposed under a negative original, thereafter heated, subjected to an overall exposure, and then imaged in the non-image areas by means of laser or electron beams or a thermal printer. In a further process variant, the photosensitive material is exposed under a negative original, thereafter heated, exposed in the non-image areas under a positive original and then imaged in the remaining non-image areas with laser or electron beams or with a thermal printer. The material exposed under a negative original is preferably heated at a temperature of from about 90° to 140° C. for a duration of from about 30 seconds to 5 minutes.

Due to the various possible combinations mentioned herein for use in the imaging of a printing plate with different screen and/or line elements, preparation of a printing form is considerably facilitated. Compared with the conventional method of preparing printing forms, in which, as is known, screen and text have to be mounted or copied, respectively, on a common film, the process of the present invention also has the advantage that screens or images, respectively, and texts can be mounted independently of each other on separate films or can be taken from digital data carriers and copied independently of each other onto the same printing plate. This results in a considerable saving of time and film material.

A great number of known compounds and mixtures, such as phosphonium, sulfonium and iodonium salts, halogen compounds and organometal/organohalogen combinations, are suitable for use as the compounds which form strong acids upon exposure to light.

As a rule, the above-mentioned phosphonium, sulfonium and iodonium compounds are used in the form of their salts which are soluble in organic solvents, usually as a precipitate with complex acids, for example, tetrafluoroboric acid, hexafluorophosphoric acid, hexafluoroantimonic acid and hexafluoroarsenic acid.

As the halogen-containing photosensitive compounds which form hydrohalogenic acid, any organic halogen compounds can basically be used that are also known as photochemical free-radical initiators, for example, those which have more than one halogen atom on a carbon atom or on an aromatic ring. Examples are described in U.S. Pat. Nos. 3,515,552; 3,536,489 and 3,779,778, in German Patent 26 10 842 and in German Offenlegungsschriften 22 43 621; 27 18 259 and 33 37 024. Of these compounds, the s-triazine derivatives are preferred that contain 2 methyl halide groups, in particular trichloromethyl groups, and an aromatic or unsaturated substituent, respectively, in the triazine nucleus. The 2-trichloromethyl-1,3,4-oxadiazoles described in German Offenlegungsschriften 28 51 471 and 28 49 396 are likewise well suited. The effect of these halogen-containing compounds can also be spectrally influenced and enhanced by known sensitizers. Examples of suitable initiators are:

4-methyl-6-trichloromethyl-2-pyrone,
4-(3,4,5-trimethoxystyryl)-6-trichloromethyl-2-pyrone,
4-(4-methoxystyryl)-6-(3,3,3-trichloropropenyl)-2-pyrone,
2-trichloromethylbenzimidazole,
2-tribromomethylquinoline,
2,4-dimethyl-1-tribromoacetylbenzene,
3-nitro-1-tribromoacetylbenzene,
4-dibromomethyl-s-triazine,
1,4-bis-dibromoacetylbenzene,
tris-dibromomethyl-s-triazine,
2-(6-methoxy-naphth-2-yl)-,
2-(naphth-1-yl)-,
2-(naphth-2-yl)-,
2-(4-ethoxyethyl-naphth-1-yl)-,
2-(benzopyran-3-yl)-,
2-(4-methoxyanthrac-1-yl)-,
2-(4-styrylphenyl)-,
2-(phenanthr-9-yl)-4,6-bis-trichloromethyl-s-triazine.

The quantity of initiator used can also vary depending on its chemical nature and on the composition of the layer. Favorable results are obtained using from about 0.5 to 20% by weight, preferably from about 1.0 to 12% by weight, based on total solids. In particular in photosensitive layers having thicknesses over about 0.01 mm it is advisable to use a relatively small amount of acid donor.

Compounds which can be split by acid, which may be mentioned include:
A) Compounds containing at least one orthocarboxylic acid ester and/or carboxylic acid amide acetal moiety; the compounds can also have a polymeric character and the moieties mentioned can be present as linking members in the principal chain or as lateral substituents.
B) Oligomeric or polymeric compounds containing recurrent acetal and/or ketal moieties in the principal chain.
C) Compounds containing at least one enol ether or N-acyliminocarbonate moiety.

Compounds which can be split by acid, used as components of photosensitive compositions are described in detail in U.S. Pat. No. 4,101,323 and in European Patent Application 0 022 571.

As the compound containing at least one bond which can be split by acid, a polyacetal is preferably used, in particular a polyacetal prepared from triethylene glycol and 2-ethylbutyraldehyde.

Further compounds which can be split by acid are those containing at least one silylether group of the formula

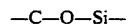

Compounds of this kind are described, for example, in German Offenlegungsschrift 35 44 165 or in European Patent Application 0 130 599.

The proportion of cleavable compound used may be varied between about 4 and 50% by weight, preferred is a quantity of from about 5 to 30% by weight, based on the non-volatile constituents of the photosensitive layer.

The photosensitive layer also contains a polymeric, water-insoluble binder, that is soluble in organic solvents. Since the developing liquids used for the exposed layers are advantageously comprised of aqueous-alkaline solutions and the latter are, in general, preferred to developers based on organic solvents, binders are used that are soluble or at least swellable in aqueous alkalis.

The type and quantity of the binders used may vary depending on the intended application; preference is given to proportions between about 30 and 90% by weight, particularly between about 50 and 80% by weight, based on total solids.

The phenolic resins, above all novolacs, which are widely used in many positive-working photosensitive materials have also proved particularly useful and advantageous for use in the materials according to the present invention. They promote the strong differentiation between exposed and unexposed layer areas upon development, in particular the more highly condensed resins with substituted phenols, e.g., cresols, as reaction partners for the condensation with formaldehyde. The novolacs can also be modified in a known manner by reacting part of their hydroxyl groups, for example, with chloroacetic acid, isocyanates, epoxides, or carboxylic acid anhydrides. Copolymers of maleic anhydride and styrene, vinyl acetate and crotonic acid, methyl methacrylate and methacrylic acid or polymers and copolymers of acrylic or methacrylic acid phenol esters are preferred.

A great number of other resins can additionally be employed, that may either be soluble in water or insoluble in alkali, preferably vinyl polymers, such as polyvinyl acetates, polyacrylates, polyvinyl ethers and polyvinylpyrrolidones, which themselves may be modified by comonomers. The most favorable proportion of these resins depends on application related requirements and on their influence on development conditions and generally does not exceed about 20% of the alkali-soluble resin. To meet special requirements, such as flexibility, adhesion, gloss, etc., the photosensitive layer can also contain minor quantities of substances, such as polyglycols, cellulose ethers, e.g., ethyl cellulose, wetting agents, dyes and finely divided pigments.

Moreover, soluble or also finely divided dispersible dyes and, depending on the intended application, even UV absorbers may be added to the photosensitive layer. Triphenylmethane dyes, in particular in the form of their carbinol bases, have proved particularly suitable. The most favorable quantitative proportions of the components can readily be determined by means of preliminary tests, carried out in each individual case.

The layer thickness of the photosensitive layer basically depends on the intended application of the material. It can generally range between about 500 nm and 0.08 mm, preferably between about 0.001 and 0.05 mm. For layers on printing plates and for photoresist layers which are to be applied from solutions, layer thicknesses in the range from about 0.001 to 0.01 mm are preferred.

Suitable supports for the photosensitive compositions include any materials conventionally used in the art for copying processes. Examples which may be mentioned are paper, plastic films, copper-plated insulating boards, mechanically or electrochemically grained and optionally anodically oxidized aluminum, supports for screen printing stencils, wood, ceramics, glass and silicon, the surface of which may have been chemically converted, e.g., into silicon nitride or silicon dioxide.

Preferred supports for thick layers above about 0.01 mm comprise plastic films which then serve as temporary supports for transfer layers. For this purpose and for color-proofing films, polyester films, e.g., of polyethylene terephthalate, are preferred. Films of polyolefin, e.g., of polypropylene, are also suitable. In most cases, the supports used for layer thicknesses of less than about 0.01 mm are metals. The following can be used for offset printing plates: mechanically or chemically grained and optionally anodically oxidized aluminum, which additionally may have been chemically pretreated, for example, with polyvinylphosphonic acid, silicates, phosphates, hexafluorozirconates or with hydrolyzed tetraethyl orthosilicate, and, in addition, multi-metal plates with Cu/Cr or brass/Cr as the top layer.

For coating a suitable support, the compositions are usually dissolved in a solvent. The selection of solvents depends on the intended coating process, the layer thickness and the drying conditions. Suitable solvents for the composition of the invention include ketones, such as methyl ethyl ketone; chlorinated hydrocarbons, such as trichloroethylene and 1,1,1-trichloroethane; alcohols, such as n-propanol; ethers, such as tetrahydrofuran; alcohol ethers, such as ethylene and propylene glycol monoethyl ether; and esters, such as butyl acetate. It is also possible to use mixtures which, for special purposes, may additionally contain solvents, such as acetonitrile, dioxane or dimethyl formamide. In principle, any solvents can be used, which do not irreversibly react with the layer components. Partial ethers of glycols, in particular ethylene glycol monomethyl ether and propylene glycol monomethyl ether are particularly preferred.

Coating of the support is carried out in a known manner by means of spin-coating, spraying, dipping, roller-coating, application with slot dies, blade-spreading or flow-coater application.

Development is carried out with aqueous-alkaline solutions having a graduated alkalinity, the pH being preferably in the range from about 10 to 14, and which may also contain relatively small amounts of organic solvents or wetting agents. Preferred developers comprise aqueous solutions of alkaline substances, for example, of alkali metal phosphates, silicates, carbonates or hydroxides, which can additionally contain wetting agents or relatively small amounts of organic solvents. In particular cases, organic solvents or mixtures of organic solvents with water are also suitable for use as developers.

The process of the present invention can, for example, be used in the production of printing forms for letterpress, gravure and planographic printing, in the production of photoresist stencils for the subtractive and additive preparation of printed circuit boards, in the production of nickel screen printing cylinders prepared by an electroplating proccess, and in the production of masks in microelectronics, according to the lift-off technique.

In the examples which follow, embodiments of the process according to the present invention are described. Percentages and quantitative ratios are to be understood as units of weight, unless otherwise specified.

EXAMPLE 1

An electrochemically grained and anodically oxidized aluminum sheet is coated with a solution of:

| | |
|---|---|
| 1.60 parts by weight | of a polyacetal prepared from triethylene glycol and 2-ethylbutyraldehyde, |

-continued

| | | |
|---|---|---|
| 0.30 part by weight | of 2,4-bis-(trichloromethyl)-6-p-stilbenyl-s-triazine. | |
| 6.00 parts by weight | of a cresol-formaldehyde novolac having a softening point in the range from 127–145° C., | |
| 0.05 part by weight | of crystal violet base in | |
| 40.00 parts by weight | of ethylene glycol monomethyl ether and | |
| 40.00 parts by weight | of tetrahydrofuran. | |

The photosensitive material thus prepared comprises a photosensitive layer having a layer weight of 2.75 g/m².

For the preparation of a printing form the photosensitive layer is first subjected to an overall exposure without an original, using one of the customary printing lamps. A krypton laser is then used for imagewise irradiation in the visible region, mainly at the wavelengths 647 nm or 676 nm, at a radiative power of 4 watts and a recording speed of 1 cm/second. Without any further intermediate treatment, the printing plate is then developed with a 5% strength aqueous-alkaline sodium silicate solution and, in the process, the layer areas which were not struck by the laser beam are removed. The layer areas which were contacted by the laser beam are hardened and rendered oleophilic; they accept greasy printing ink when the printing form is used in an offset printing machine and yield a good print run.

It is also possible to use the present invention for the various combinations which are feasible in the imaging of printing plates with combined line and/or screen elements, as is similarly known from the photocomposing method. The printing plate prepared as described above is, for example, first imagewise exposed under a positive original during 15 exposure units, with the aid of a 500 watts metal halide lamp arranged at a distance of 103 cm and is thereafter imagewise irradiated with a laser beam, for example with a krypton laser, as indicated above, in the still non-imaged layer areas. The printing plate imagewise exposed and irradiated in this manner is developed with a 5% strength aqueous-alkaline sodium silicate solution, without any further intermediate steps and, as a result, the final printing form is obtained.

To effect image reversal, the normally positive-working printing plate prepared as described above is exposed during 15 exposure units under a negative original, then heated for 2 minutes at 125° C., subjected to an overall re-exposure during 15 exposure units and developed with a 5% strength sodium silicate solution to give the final printing form.

According to another possibility of imaging, the printing plate which has been exposed under the negative original is first heated for 2 minutes at 125° C. and subjected to an overall re-exposure. A krypton laser, mainly emitting at the wavelengths 647 nm or 676 nm, which has a radiative power of 4 watts and a recording speed of 1 cm/second is then used to irradiate the plate imagewise in the non-image areas which were covered during the first exposure.

After developing with a 5% strength aqueous solution of sodium silicate the final printing form is obtained.

COMPARATIVE EXAMPLE 1

To show the excellent photosensitivity of the photosensitive layers according to the present invention, the polyacetal used above is replaced by the same quantity of an o-quinone diazide compound, e.g., by the reaction product of 1 mole of 2,3,4-trihydroxybenzophenone and 3 moles of 1,2-naphthoquinone-2-diazide-5-sulfonic acid chloride and a corresponding printing plate is prepared under otherwise identical conditions. Upon exposure under a positive test original including a continuous-tone step wedge, the quinone-diazide-containing printing plate has to be exposed during 150 exposure units to obtain the same copying result, e.g., the same length of the continuous-tone step wedge, as obtained after exposing the printing plate prepared according to the present invention for only 15 exposure units, under the same test conditions.

This comparison example shows clearly that the presensitized printing plates according to the present invention have a higher photosensitivity and thus require a substantially shorter exposure time than the corresponding photosensitive layers prepared with o-quinone diazides, such as those used, for example, in U.S. Pat. No. 4,544,627. Due to the relatively high photosensitivity of the photosensitive layers used according to this invention, it is possible considerably to reduce the times required for the various imaging possibilities according to the invention.

EXAMPLE 2

An electrochemically grained and anodically oxidized aluminum sheet is coated with a solution of:

| | | |
|---|---|---|
| 1.40 parts by weight | of a polyorthoester prepared from 7,7-bis-hydroxymethyl-5-oxa-nonanol-(1) and trimethyl orthoformate, | |
| 0.25 part by weight | of 2,4-bis-(trichloromethyl)-6-p-stilbenyl-s-triazine, | |
| 5.00 parts by weight | of a cresol-formaldehyde novolac having a softening point in the range from 127–145° C., | |
| 0.04 part by weight | of crystal violet base in | |
| 40.00 parts by weight | of propylene glycol monomethyl ether and | |
| 40.00 parts by weight | of tetrahydrofuran. | |

The presensitized material prepared in this manner, the photosensitive layer of which has a layer weight of about 2.30 g/m² is first processed to give a negative printing plate. For this purpose, the sample is imagewise exposed during 20 exposure units under a negative original, then heated for 2 minutes at 130° C. and thereafter re-exposed without an original for the same time as used in the imagewise negative exposure. The plate is then imagewise irradiated in the non-image areas of the negative image, by means of a krypton laser, mainly emitting at the wavelengths 647 nm or 676 nm, which has a radiative power of 6 watts and a recording speed of 1 cm/second. After developing with a 3% strength aqueous-alkaline sodium silicate solution the final printing form is obtained.

EXAMPLE 3

An electrochemically grained and anodically oxidized aluminum sheet is coated with a solution of:

| | | |
|---|---|---|
| 1.60 parts by weight | of a polyacetal prepared from triethylene glycol and 2-ethylbutyraldehyde, | |
| 0.30 part by weight | of 2,4-bis-(trichloromethyl)- | |

| | |
|---|---|
| 6.00 parts by weight | 6-(4-ethoxy-naphth-1-yl)-s-triazine. of a cresol-formaldehyde novolac having a softening point in the range from 127–145° C., |
| 0.05 part by weight | of crystal violet base in |
| 40.00 parts by weight | of ethylene glycol monomethyl ether and |
| 40.00 parts by weight | of tetrahydrofuran. |

The photosensitive layer of the material prepared in this manner has a layer weight of 2.80 g/m².

For the preparation of a printing form, the photosensitive material thus prepared is subjected to an overall exposure to ultraviolet light and then imagewise irradiated with an argon laser in the visible region mainly at the wavelengths 488 nm or 514 nm, at a radiative power of 5 watts and a recording speed of 1 cm/second. After developing with a 5% strength aqueous-alkaline sodium silicate solution the final printing form is obtained.

According to another application, the printing plate prepared as described above is first imagewise exposed to ultraviolet light under a positive original and then imagewise irradiated in the still non-imaged layer area, with the aid of the above indicated laser. The printing plate which has been imagewise exposed and irradiated is developed with a 5% strength aqueous-alkaline sodium silicate solution without any further intermediate steps and, as a result, the final printing form is obtained.

EXAMPLE 4

An electrochemically grained and anodically oxidized aluminum sheet is coated with a solution of:

| | |
|---|---|
| 1.80 parts by weight | of a polyorthoester prepared from 7,7-bis-hydroxymethyl-5-oxa-nonanol-(1) and trimethyl orthoformate. |
| 0.30 part by weight | of 2,4-bis-(trichloromethyl)-6-(4-ethoxy-naphth-1-yl)-s-triazine, |
| 6.00 parts by weight | of a cresol-formaldehyde novolac having a softening point in the range from 127–145° C., |
| 0.05 part by weight | of crystal violet base in |
| 40.00 parts by weight | of ethylene glycol monomethyl ether and |
| 40.00 parts by weight | of tetrahydrofuran. |

The photosensitive material thus prepared carrying a photosensitive layer with a layer weight of about 2.60 g/m² is imagewise exposed under a transparent positive original, as indicated in Example 1 and the exposed layer areas are then imaged with an electron beam at a current strength of 1 μA and an accelerating voltage of 20 kV. After developing with a 4% strength aqueous-alkaline sodium silicate solution the final printing form is obtained.

EXAMPLE 5

An appropriate polyester film and an appropriately pretreated paper sheet, e.g., a paper sheet prepared as described in U.S. Pat. No. 2,681,617, are coated with a solution of:

| | |
|---|---|
| 1.60 parts by weight | of a polyacetal prepared from triethylene glycol and 2-ethylbutyraldehyde. |
| 0.30 part by weight | of 2,4-bis-(trichloromethyl)-6-p-stilbenyl-s-triazine. |
| 6.00 parts by weight | of a cresol-formaldehyde novolac having a softening point in the range from 127–145° C., |
| 0.05 part by weight | of crystal violet base in |
| 40.00 parts by weight | of ethylene glycol monomethyl ether and |
| 40.00 parts by weight | of tetrahydrofuran. |

The photosensitive materials thus prepared are first subjected to an overall exposure without an original, using one of the customary printing lamps and then treated with a thermal printer. By the temperature of the thermohead (150°–200° C.) the layers are irreversibly changed in the areas contacted by the thermohead, they are rendered oleophilic and insoluble in the developer. After developing with a 5% strength aqueous solution of sodium metasilicate the final printing forms are obtained.

EXAMPLE 6

An electrochemically grained and anodically oxidized aluminum sheet is coated with a solution of:

| | |
|---|---|
| 1.60 parts by weight | of a polysilylether, prepared from dichlorodimethylsilane and 1,4-bis-(2-hydroxyethoxy)-benzene |
| 0.30 part by weight | of 2,4-bis-(trichloromethyl)-6-p-stilbenyl-s-triazine, |
| 5.60 parts by weight | of a cresol-formaldehyde novolac, |
| 0.05 part by weight | of crystal violet base in |
| 40.00 parts by weight | of ethylene glycol monomethyl ether and |
| 50.00 parts by weight | of tetrahydrofuran. |

The photosensitive layer of the material prepared in this manner has a layer weight of 2.45 g/m².

For the preparation of a printing form, the photosensitive layer is first subjected to an overall exposure without an original using one of the customary printing lamps. A krypton laser is then used for imagewise irradiation in the visible region, mainly at the wavelengths 647 nm or 676 nm, at a radiative power of 4 watts and a recording speed of 1 cm/second. Without any further intermediate treatment, the printing plate is then developed with a 5% strength aqueous-alkaline sodium silicate solution, removing the layer areas not struck by the laser beam. The areas contacted by the laser beam have been rendered oleophilic and are hardened, they accept greasy ink when used in an offset printing machine and yield a good print run.

EXAMPLE 7

An electrochemically grained and anodically oxidized aluminum sheet is coated with a solution of:

| | |
|---|---|
| 1.60 parts by weight | of a polysilylether prepared from dichlorodimethylsilane and bis-(2-hydroxyethyl)-2,4 toluylene dicarbamate. |
| 0.30 part by weight | of 2,4-bis (trichloromethyl)-6-p-methoxystyryl-s-triazine. |
| 6.00 parts by weight | of a cresol-formaldehyde novolac, |
| 0.055 part by weight | of crystal violet base in |

-continued

| 40.00 parts by weight | of propylene glycol monomethyl ether and |
| 50.00 parts by weight | of tetrahydrofuran. |

A 500 watts metal halide lamp arranged at a distance of 103 cm is used for the imagewise exposure of the printing plate under a positive original during 10 exposure units. Thereafter, the still non-imaged layer areas are imagewise irradiated with the aid of a laser beam, for example, with a krypton laser, as indicated above. The printing plate which has thus been imagewise exposed and irradiated is developed with a 5% strength aqueous-alkaline sodium silicate solution, without any further intermediate steps and, as a result, the final printing form is obtained.

What is claimed is:

1. A process for producing images on a photosensitive material comprising a support and a normally positive-working photosensitive layer, the process comprising the steps of:
    activating the photosensitive layer by exposure to ultraviolet light;
    imagewise heating of selected regions within the UV activated region by means of a laser beam, electron beam or thermal printer to produce thermally hardened regions in the UV activated region; and
    developing with an aqueous-alkaline developer,
    wherein a mixture comprising a compound containing at least one —C—O—C— or —C—O—Si— bond which can be split by acid and a compound forming a strong acid upon exposure is employed in the photosensitive layer.

2. A process as claimed in claim 1, wherein a high-power ion laser emitting at wavelength above 500 nm is used for imaging.

3. A process as claimed in claim 1, wherein electron beams having a current strength of at least 1 $\mu$A and an accelerating voltage of 10 kV are used for imaging.

4. A process as claimed in claim 1, wherein imaging is carried out by point-for-point heating using a thermal printer.

5. A process as claimed in claim 1, wherein the photosensitive material is exposed under a positive original and an image is then produced in the non-image areas of the positive image by means of laser beams, electron beams or a thermal printer.

6. A process as claimed in claim 1, wherein the photosensitive material is exposed under a negative original, thereafter heated and subjected to an overall exposure and an image is then produced in the non-image areas by means of laser beams, electron beams or a thermal printer.

7. A process as claimed in claim 1, wherein the photosensitive material is exposed under a negative original, thereafter heated and exposed under a positive original in the non-image areas and an image is then produced in the remaining non-image areas by means of laser beams, electron beams or a thermal printer.

8. A process as claimed in claim 6, wherein the material that has been exposed under a negative original is heated at a temperature of from 90° to 140° C.

9. A process as claimed in claim 6, wherein the material that has been exposed under a negative original is heated for a duration of from 30 seconds to 5 minutes.

10. A process as claimed in claim 1, wherein a polyacetal is used as the compound containing at least one bond which can be split by acid.

11. A process as claimed in claim 10, wherein a polyacetal prepared from triethylene glycol and 2-ethylbutyraldehyde is used as the compound containing at least one bond which can be split by acid.

12. A process as claimed in claim 2, wherein the photosensitive material is exposed under a positive original and an image is then produced in the non-image areas of the positive image by means of laser beams, electron beams or a thermal printer.

13. A process as claimed in claim 3, wherein the photosensitive material is exposed under a positive original and an image is then produced in the non-image areas of the positive image by means of laser beams, electron beams or a thermal printer.

14. A process as claimed in claim 4, wherein the photosensitive material is exposed under a positive original and an image is then produced in the non-image areas of the positive image by means of laser beams, electron beams or a thermal printer.

15. A process as claimed in claim 7, wherein the material that has been exposed under a negative original is heated at a temperature of from 90° to 140° C.

16. A process as claimed in claim 7, wherein the material that has been exposed under a negative original is heated for a duration of from 30 seconds to 5 minutes.

17. A process as claimed in claim 1, consisting essentially of the recited steps.

18. A process as claimed in claim 5, consisting essentially of the recited steps.

19. A process as claimed in claim 6, consisting essentially of the recited steps.

20. A process as claimed in claim 7, consisting essentially of the recited steps.

* * * * *